(12) United States Patent
Young et al.

(10) Patent No.: US 9,691,617 B2
(45) Date of Patent: Jun. 27, 2017

(54) IIIA-VA GROUP SEMICONDUCTOR SINGLE CRYSTAL SUBSTRATE AND METHOD FOR PREPARING SAME

(75) Inventors: Morris Young, Fremont, CA (US); Davis Zhang, Fremont, CA (US); Vincent Wensen Liu, Beijing (CN); Yuanli Wang, Beijing (CN)

(73) Assignee: BEIJING TONGMEI XTAL TECHNOLOGY CO., LTD., Beijing (CN)

( * ) Notice: Subject to any disclaimer, the term of this patent is extended or adjusted under 35 U.S.C. 154(b) by 2 days.

(21) Appl. No.: 14/388,236

(22) PCT Filed: Mar. 26, 2012

(86) PCT No.: PCT/CN2012/000369
§ 371 (c)(1),
(2), (4) Date: Jun. 4, 2015

(87) PCT Pub. No.: WO2013/143018
PCT Pub. Date: Oct. 3, 2013

(65) Prior Publication Data
US 2015/0279678 A1    Oct. 1, 2015

(51) Int. Cl.
| | | |
|---|---|---|
| H01L 21/223 | (2006.01) | |
| H01L 29/207 | (2006.01) | |
| C30B 29/40 | (2006.01) | |
| C30B 29/42 | (2006.01) | |
| C30B 31/00 | (2006.01) | |
| H01L 21/324 | (2006.01) | |

(52) U.S. Cl.
CPC .......... *H01L 21/2233* (2013.01); *C30B 29/40* (2013.01); *C30B 29/42* (2013.01); *C30B 31/00* (2013.01); *H01L 21/3245* (2013.01); *H01L 29/207* (2013.01)

(58) Field of Classification Search
CPC ...................................................... C30B 29/42
See application file for complete search history.

(56) References Cited

U.S. PATENT DOCUMENTS

2007/0012238 A1* 1/2007 Kretzer ................... C30B 11/00
                                                                 117/19
2014/0261156 A1* 9/2014 Brize ................. H01L 21/02628
                                                                117/60

OTHER PUBLICATIONS

CN102363897 Translation.*

\* cited by examiner

*Primary Examiner* — Whitney T Moore
(74) *Attorney, Agent, or Firm* — Hultquist, PLLC; Steven J. Hultquist

(57) ABSTRACT

A IIIA-VA group semi-conductor single crystal substrate (2) has one of or both of the following two properties: an oxygen content of $1.6 \times 10^{16}$-$5.6 \times 10^{17}$ atoms/cm$^3$ in a range from the surface to a depth of 10 μm of the wafer, and an electron mobility of 4,800 cm$^2$/V·s-5,850 cm$^2$/V·s. Further, a method for preparing the semi-conductor single crystal substrate (2) comprises: placing a single crystal substrate (2) to be processed in a container (4); sealing said container (4), and keeping said single crystal substrate (2) to be processed at a temperature in the range of from the crystalline melting point −240° C. to the crystalline melting point −30° C. for 5 hours to 20 hours; preferably, keeping a gallium arsenide single crystal at a temperature of 1,000° C. to 1,200° C. for 5 hours to 20 hours.

9 Claims, 1 Drawing Sheet

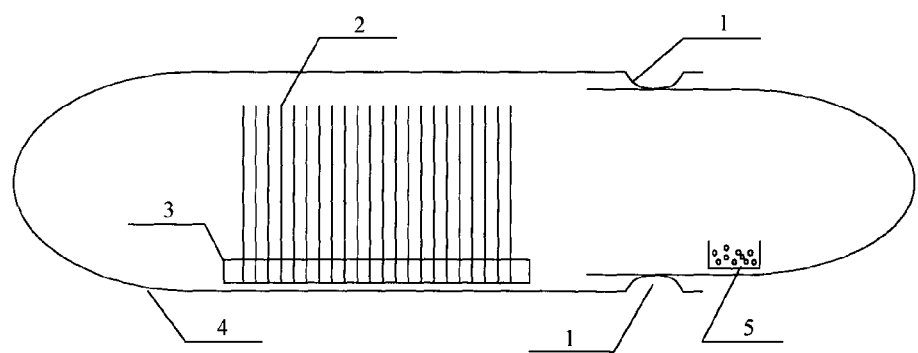

IIIA-VA GROUP SEMICONDUCTOR SINGLE CRYSTAL SUBSTRATE AND METHOD FOR PREPARING SAME

CROSS-REFERENCE TO RELATED APPLICATIONS

The present application is a national stage application filed under 35 U.S.C. §371 based on International Patent Application No. PCT/CN2012/000369, filed Mar. 26, 2012, and published as WO 2013/143018 A1 on Oct. 3, 2013. The present application claims the benefit of priority to International Patent Application No. PCT/CN2012/000369. The entire contents of International Patent Application No. PCT/CN2012/000369 are expressly incorporated herein by reference.

TECHNICAL FIELD

The present invention relates to a IIIA-VA group semi-conductor single crystal substrate and a method for preparing the same, wherein said IIIA-VA group semi-conductor single crystal substrate has a high electron mobility or a high oxygen content in its surface, or has both a high electron mobility and a high oxygen content in its surface.

BACKGROUND ART

The IIIA-VA group semi-conductor (semi-conductor formed of IIIA group and VA group elements, such as GaAs, InP or GaP) single crystal substrate is widely used in fields like microwave communication, infrared detection, high-efficiency solar cell, high power laser and LED, and is one of the most important basic group of materials. To meet different application requirements, sometimes there is a need to dope the surface of the single crystal substrate, for example by introducing oxygen in the substrates for subsequent to epitaxial growth for the preparation of pHEMTs (pseudomorphic High Electron Mobility Transistors) and HBTs (Hetero-junction Bipolar Transistors). H. Ch. Alt, Y. V. Gomeniuk and U. Kretzer have discussed the preparation of the oxygen-containing GaAs crystal (cf. the Journal Of Applied Physics, 101, 073516 (2007)), wherein $Ga_2O_3$ or $As_2O_3$ is added into GaAs charge, and then Liquid-encapsulated Czochralski (Cz) and Vertical Gradient Freeze (VGF) methods are used for growing the crystal, so that oxygen can be introduced into the crystal which has an oxygen concentration of only $0.6-1.1 \times 10^{16}$ atoms/$cm^3$. The crystal prepared according to said method has an approximately uniform oxygen distribution; however, the dispersion of oxygen throughout the crystal will inevitably negatively affect the structure of the crystal. Currently, in practical use, the effective part of a crystal substrate is only near the surface within a certain depth, in other words, in order to satisfy practical needs, it is sufficient to merely control the physical and chemical properties of the substrate near surface up to a certain depth. For example, for an oxygen doped crystal substrate, there is no requirement for oxygen content of the inner part thereof, and only the surface part of a certain depth needs to be controlled.

On the other hand, electron mobility of a IIIA-VA group semi-conductor single crystal substrate is an important parameter and is changed generally by doping the semi-conductor materials. Also, if impurities are introduced during single crystal material production, overall integrity of the single crystal material will be adversely affected.

In the present industry, there is a need for a IIIA-VA group semi-conductor single crystal substrate and a method for preparing the same to make the IIIA-VA group semi-conductor single crystal substrate material with a high electron mobility or a high oxygen content within a certain depth from the surface or have both a high electron mobility and a high oxygen content in its surface.

SUMMARY OF THE INVENTION

It is an object of the present invention to provide a IIIA-VA group semi-conductor single crystal substrate having one of or both of the following two properties:
- an oxygen content of $1.6 \times 10^{16}$-$5.6 \times 10^{17}$ atoms/$cm^3$ (i.e. atom number per cubic centimeter of the wafer) in a range from the surface to a depth of 10 μm of the wafer; and
- an electron mobility of 4,800 $cm^2/V \cdot s$ to 5,850 $cm^2/V \cdot s$ (tested at 25 degrees Centigrade (25° C.)) with an international standard electron mobility testing method for semi-insulating GaAs materials, international standard No. SEMI M39-0999).

It is another object of the present invention to provide a method for preparing a IIIA-VA group semi-conductor single crystal substrate having one of or both of the following two properties:
- an oxygen content of $1.6 \times 10^{16}$-$5.6 \times 10^{17}$ atoms/$cm^3$ in a range from the surface to a depth of 10 μm of the wafer; and
- an electron mobility of 4,800 $cm^2/V \cdot s$ to 5,850 $cm^2/V \cdot s$;

the method comprising
- placing a single crystal substrate to be processed in a container; and
- sealing said container, and keeping said single crystal substrate to be processed at a temperature in the range of from the crystalline melting point −240° C. to the crystalline melting point −30° C. for 5 to 20 hours.

DESCRIPTION OF THE FIGURES

FIG. 1 diagrammatically shows an embodiment of processing the single crystal substrate according to the present invention.

MODE FOR CARRYING OUT THE INVENTION

In the present specification, unless otherwise specified, each operation is carried out at normal temperature and pressure.

The IIIA-VA group semi-conductor single crystal substrate according to the present invention comprises GaAs, InP or GaP single crystal substrate. Methods like Vertical Gradient Freeze (VGF), Vertical Brigdman (VB) and Liquid-Encapsulated Czochralski (LEC) can be adopted to grow a crystal ingot which is then cut into wafers.

In the present specification, unless otherwise specified, "single crystal substrate" and "wafer" are both mono-crystalline, and preferably have a thickness of not more than 1000 μm and not less than 250 μm. They have been chemically etched and washed by water which has a resistivity of not lower than $1.5 \times 10^7$ Ω·cm at 25° C., preferably not lower than $1.8 \times 10^7$ Ω·cm, and have been dried.

In the present specification, "single crystal substrate" or "wafer" is round or in other shapes, such as square or other polygons. Preferably, a round shape with a diameter of 2.5-15 cm (approximately 1-6 inches).

The IIIA-VA group semi-conductor single crystal substrate according to the present invention has one of or both of the following two properties:

an oxygen content of $1.6 \times 10^{16}$-$5.6 \times 10^{17}$ atoms/cm$^3$ in a range from the surface to a depth of 10 μm of the wafer; and an electron mobility of 4,800 cm$^2$/V·s to 5,850 cm$^2$/V·s.

The IIIA-VA group semi-conductor single crystal substrate according to the present invention has an oxygen content of $1.6 \times 10^{16}$-$5.6 \times 10^{17}$ atoms/cm$^3$ in a range from the surface to a depth of about 10 μm of the wafer, preferably $2 \times 10^{16}$-$5.6 \times 10^{17}$ atoms/cm$^3$, more preferably $3.5 \times 10^{16}$-$5.5 \times 10^{17}$ atoms/cm$^3$, most preferably $5 \times 10^{16}$-$5.5 \times 10^{17}$ atoms/cm$^3$. It is clear to a person skilled in the art that, by means of polishing the wafer surface, the IIIA-VA group semi-conductor single crystal substrate can also obtain an oxygen content of $8 \times 10^{16}$-$5.5 \times 10^{17}$ atoms/cm$^3$ in a range from the surface to a depth of about 10 μm of the wafer, or $1.0 \times 10^{17}$-$5.5 \times 10^{17}$ atoms/cm$^3$, even $2 \times 10^{17}$-$5.5 \times 10^{17}$ atoms/cm$^3$ or $2.5 \times 10^{17}$-$5.5 \times 10^{17}$ atoms/cm$^3$, and even $3.5 \times 10^{17}$-$5.5 \times 10^{17}$ atoms/cm$^3$.

For example, in a preferred embodiment according to the present invention, the IIIA-VA group semi-conductor single crystal substrate has an oxygen content of $2 \times 10^{17}$-$5.5 \times 10^{17}$ atoms/cm$^3$ in a range from the surface to a depth of about 10 μm of the wafer, and preferably, it has an oxygen content of $2.5 \times 10^{17}$-$5.5 \times 10^{17}$ atoms/cm$^3$, more preferably $3.5 \times 10^{17}$-$5.5 \times 10^{17}$ atoms/cm$^3$; the single crystal substrate has an oxygen content of $0.8$-$4 \times 10^{17}$ atoms/cm$^3$ at the depth of 50-60 μm of the wafer, and preferably, it has an oxygen content of $1.0$-$3.7 \times 10^{17}$ atoms/cm$^3$, more preferably $1.2$-$3.7 \times 10^{17}$ atoms/cm$^3$; and the single crystal substrate has an oxygen content of $2$-$6.5 \times 10^{16}$ atoms/cm$^3$ at the depth of 80-90 μm of the wafer, and preferably, it has an oxygen content of $3.5$-$6.2 \times 10^{16}$ atoms/cm$^3$, more preferably $4.0$-$6.2 \times 10^{16}$ atoms/cm$^3$. Thus, the desired oxygen content of a certain depth can be selectively obtained by polishing the surface.

The IIIA-VA group semi-conductor single crystal substrate according to the present invention has an electron mobility of 4,800 cm$^2$/V·s to 5,850 cm$^2$/V·s, preferably 4,900 cm$^2$/V·s to 5,800 cm$^2$/V·s.

In a preferred embodiment according to the present invention, the IIIA-VA group semi-conductor single crystal substrate is a GaAs single crystal substrate.

A method according to the present invention for preparing an IIIA-VA group semi-conductor single crystal substrate, comprising placing a single crystal substrate to be processed in a container; and sealing said container, and keeping said single crystal substrate to be processed at a temperature in the range of from the crystalline melting point −240° C. to the crystalline melting point −30° C. for 5-20 hours, preferably 8-12 hours; for example, preferably, keeping GaAs single crystal at a temperature of 1000-1200° C. for 5-20 hours, preferably 8-12 hours, or keeping InP single crystal at a temperature of 830-1028° C. for 5-20 hours, preferably 8-12 hours.

In the present invention, "the range of from the crystalline melting point −240° C. to the crystalline melting point −30° C." refers to a temperature range (° C.) formed with a lower limit obtained by subtracting 240 from the melting point of the processed wafer (or single crystal) and with an upper limit obtained by subtracting 30 from the melting point of the processed wafer (or single crystal).

In a preferred embodiment of the method according to the present invention, the said container is a sealable container made of quartz material. Preferably, the container is a cylindrical one, with one end being open and the other end being sealed.

In a preferred embodiment of the method according to the present invention, the wafer is placed in a quartz container by an open quartz boat, in which the wafer is kept in an upright position.

In a preferred embodiment of the method according to the present invention, after the wafer is placed in the container, As or P is also placed in the container.

In a preferred embodiment according to the present invention, the single crystal substrate is prepared as follows: growing the IIIA-VA group semi-conductor single crystal material by the method of Vertical Gradient Freeze, cutting the resulting single crystal bar into wafers by a wire saw, followed by chamfering the wafer edge and chemically etching its surface, washing the etched wafer with de-ionized water which has a resistivity of $1.5 \times 10^7$ Ω·cm to remove contamination on its surface, and drying the wafer to obtain the single crystal substrate to be processed.

In a preferred embodiment, as shown in FIG. 1, the wafer 2 is placed in the quartz container 4 by a quartz boat 3 (an open quartz container wherein the wafer is kept in an upright position). There is no special demand for the volume of the quartz container 4, as long as it is capable of containing the wafer 2 and the quartz boat 3. There is no special demand for the placement of the wafers in the container; however, for the convenience of processing, some interspaces are preferably maintained between them.

After the wafer 2 is placed into the container, according to the type of the wafer to be processed, As or P (placed in the small container 5) is placed into the container if necessary, with an amount at least enabling vapour pressure of 0.5-1.8 atmosphere (preferably 0.6-1.6 atmosphere, more preferably 0.8-1.2 atmosphere) at heat treatment temperature, so as to prevent the wafer from decomposing and softening during the heating process. For example, preferably, the added amount of arsenic or phosphorus should ensure that vapour pressure of arsenic (based on As$_2$) or phosphorus (based on P) in the quartz container is within the range of 0.6-1.6 atmosphere, preferably 0.8-1.2 atmosphere during annealing process of high temperature wafer. Then, the quartz container is sealed (sealing position 1). The sealed quartz container is placed into heating furnace; and the temperature is increased to 1000-1200° C., preferably 1000-1180° C., at a rate of 40-100° C./h and is maintained for 5-20 hours, preferably 8-12 hours. Then, after the temperature is cooled to room temperature, the quartz container is cut open and the processed wafer is taken out.

As long as the method according to the present invention is carried out within the above mentioned temperature range, the final oxygen content of the wafer will be within the above mentioned concentration range. It can now be deemed, that under the above mentioned processing condition, the oxygen in the wafer near surface region (oxygen adsorbed on the surface, etc.) and residual oxygen within the processing container are the main cause of the changed oxygen content of the wafer, and the oxygen is redistributed under the processing conditions.

The oxygen content of the processed wafer is measured by SIMS (secondary ion mass spectrometer), and the oxygen content of the single crystal substrate increase from less than $1.5 \times 10^{16}$ atoms/cm$^3$ for the as-grown crystal to $1.6 \times 10^{16}$-$5.6 \times 10^{17}$ atoms/cm$^3$ in a range from the surface to a depth of 10 μm of the wafer, preferably $2 \times 10^{16}$-$5.6 \times 10^{17}$ atoms/cm$^3$ (if necessary, removing part of the surface layer through polishing to select the desired oxygen content of the surface of a certain depth), and more preferably, the oxygen content is $3.5\times10^{16}$-$5.5\times10^{17}$ atoms/cm$^3$, further preferably $5\times10^{16}$-$5.5\times10^{17}$ atoms/cm$^3$. Of course, by polishing the surface of the wafer, the IIIA-VA group semi-conductor single crystal substrate can also obtain an oxygen content of $8\times10^{16}$-$5.5\times10^{17}$ atoms/cm$^3$ in a range from the surface to a depth of about 10 µm of the wafer, or $1.0\times10^{17}$-$5.5\times10^{17}$ atoms/cm$^3$, even $2\times10^{17}$-$5.5\times10^{17}$ atoms/cm$^3$, or $2.5\times10^{17}$-$5.5\times10^{17}$ atoms/cm$^3$, and even $3.5\times10^{17}$-$5.5\times10^{17}$ atoms/cm$^3$. Thus, the oxygen doping of the single crystal material is perfectly realized.

In a preferred embodiment according to the present invention, after 50 µm of the surface of the heat treated single crystal substrate is removed by one-side polishing, the oxygen content of the wafer is measured by SIMS, and the wafer that is removed of 50 µm from the surface has an oxygen content of $0.8$-$4\times10^{17}$ atoms/cm$^3$ in a range from the surface to the depth of 10 µm of the wafer (i.e. at a depth of 50-60 µm of the heat processed single crystal substrate), and preferably, it has an oxygen content of $1.0$-$3.7\times10^{17}$ atoms/cm$^3$, more preferably $1.2$-$3.7\times10^{17}$ atoms/cm$^3$.

In a preferred embodiment according to the present invention, after 80 µm of the surface of the heat treated single crystal substrate is removed by one-side polishing, the oxygen content of the wafer is measured by SIMS, and the wafer that is removed of 80 µm from the surface has an oxygen content of $3$-$6.5\times10^{16}$ atoms/cm$^3$ in a range from the surface to the depth of 10 µm of the wafer (i.e. at a depth of 80-90 µm of the heat processed single crystal substrate), and preferably, it has an oxygen content of $3.5$-$6.2\times10^{16}$ atoms/cm$^3$, more preferably $4.0$-$6.2\times10^{16}$ atoms/cm$^3$.

In a preferred embodiment of the present invention, after 200 µm (the total thickness of the wafer is more than 500 µm) of the surface of the heat treated single crystal substrate is removed by one-side polishing, the oxygen content of the wafer is measured by SIMS, and the wafer that is removed of 200 µm from the surface has an oxygen content of $2$-$2.2\times10^{16}$ atoms/cm$^3$ in a range from the surface to the depth of 10 µm of the wafer (i.e. at a depth of 200-210 µm of the heat processed single crystal substrate).

Therefore, by heat treating the wafer at the above mentioned temperature, the wafer with increased oxygen content can be prepared; and by selectively polishing the treated wafer, the desired oxygen content in the surface and at certain depth can be obtained to satisfy different needs.

After the above mentioned treatment, the IIIA-VA group semi-conductor single crystal substrate according to the present invention has an electron mobility of 4,800 cm$^2$/V·S to 5,850 cm$^2$/V·s, preferably 4,900-5,800 cm$^2$/V·s.

By the above mentioned heat treating method and the subsequent wafer deep processing procedures, single crystal material of various oxygen dopes and electron mobilities can be obtained, which has an improved electrical property.

In a preferred embodiment of the method according to the present invention, the IIIA-VA group semi-conductor single crystal substrate is a GaAs single crystal substrate.

EXAMPLES

The present invention will be illustrated in detail by examples. Nevertheless, it should be understood that these examples are not used for limiting the scope of the present invention. The scope of the present invention is limited by the claims.

Preparation of the wafer to be processed: a GaAs single crystal material having a diameter of 15.24 cm (approximately 6 inches) which was grown by the method of Vertical gradient freeze is cut into wafers having a thickness of 775 µm by a wire saw. First, the wafer edge is chamfered, and then the surface thereof is chemically eroded for 3 times (30 seconds each time), and washed by de-ionized water which has a resistivity of $1.8\times10^7$ Ω·cm (at 25° C.), and the resulting wafer has an average thickness of 765 µm and a roughness of Ra≤0.5 µm. The chemical erosion solution consists of NH$_4$OH:H$_2$O$_2$:H$_2$O=1:2:9 (volume ratio, wherein the amounts of both NH$_4$OH and H$_2$O$_2$ are based on the saturated concentration at the temperature for using). 10 wafers as samples are selected and measured by SIMS (Cameca IMS system (Cameca Ion Mass Spectra system) of American Evans Laboratory), and the GaAs wafer has an oxygen content of $1.5\times10^{16}$ atoms/cm$^3$ in a range from the surface to the depth of 10 µm of the wafer (average value of the samples, below is the same) and an electron mobility of 3,866 cm$^2$/V·s.

The electron mobility of the wafer is measured with Hall testing system (Hall testing system 7065 (Keithley Instrument Inc)) in accordance with an international standard electron mobility testing method of semi-insulating GaAs materials, international standard No. SEMI M39-0999.

Example 1

As shown in FIG. 1, 150 wafers were placed one by one in a quartz boat which was placed into a quartz tube with a volume of 24,300 cm$^3$, wherein 35 g As was placed as well. The quartz tube was evacuated to 0.5 Torr (66.66 Pa), and then sealed.

The sealed quartz tube was placed into a horizontal pipe-type soaking furnace. The temperature is increased to 1080° C. at a rate of 100° C./h and maintained for 10 hours, and then is decreased to room temperature at a rate of 100° C./h. The tube was cut open in the vicinity of the weld sealing position by thin slice grinding wheel saw, and the resulting wafers were taken out.

10 wafers as samples are selected and measured by SIMS. The GaAs wafer has an oxygen content of $4.2\times10^{17}$ atoms/cm$^3$ in a range from the surface to the depth of 10 µm of the wafer. And then the 10 sample wafers were polished. The results as follows (average value):

After 50 µm of the surface of the wafer is removed by one side polishing, the oxygen content of the wafer is measured by SIMS, and the GaAs wafer has an oxygen content of $2\times10^{17}$ atoms/cm$^3$ in a range from the surface to the sputtering depth of about 10 µm of the wafer.

After 80 µm of the surface of the wafer is removed by one side polishing, the oxygen content of the wafer is measured by SIMS, and the GaAs wafer has an oxygen content of $6\times10^{16}$ atoms/cm$^3$ in a range from the surface to the sputtering depth of about 10 µm of the wafer.

After 200 µm of the surface of the wafer is removed by one side polishing, the oxygen content of the wafer is measured by SIMS, and the GaAs wafer has an oxygen content of $2\times10^{16}$ atoms/cm$^3$ in a range from the surface to the sputtering depth of about 10 µm of the wafer.

The electron mobility is 5,760 cm$^2$/V·s

Example 2

As shown in FIG. 1, 150 wafers were placed one by one in a quartz boat which was placed into a quartz tube with a volume of 24,300 cm³, wherein 32 g As was placed as well. The quartz tube was oxygenated to 0.23 atmosphere (evacuated first and then pressurized) at 25° C., and then sealed.

The sealed quartz tube was placed into a horizontal pipe-type soaking furnace. The temperature is increased to 1080° C. at a rate of 100° C./h and maintained for 10 hours, and then is decreased to room temperature at a rate of 100° C./h. The tube was cut open in the vicinity of the weld sealing position by thin slice grinding wheel saw, and the resulting wafers were taken out.

10 wafers as samples are selected and measured by SIMS, and the GaAs wafer has an oxygen content of $4.7 \times 10^{17}$ atoms/cm³ in a range from the surface to the depth of 10 μm of the wafer, and then the 10 sample wafers were polished. The results as follows (average value):

After 50 μm of the surface of the wafer is removed by one side polishing, the oxygen content of the wafer is measured by SIMS, and the GaAs wafer has an oxygen content of $2.3 \times 10^{17}$ atoms/cm³ in a range from the surface to the sputtering depth of about 10 μm of the wafer.

After 80 μm of the surface of the wafer is removed by one side polishing, the oxygen content of the wafer is measured by SIMS, and the GaAs wafer has an oxygen content of $6 \times 10^{16}$ atoms/cm³ in a range from the surface to the sputtering depth of about 10 μm of the wafer.

After 200 μm of the surface of the wafer is removed by one side polishing, the oxygen content of the wafer is measured by SIMS, and the GaAs wafer has an oxygen content of $2 \times 10^{16}$ atoms/cm³ in a range from the surface to the sputtering depth of about 10 μm of the wafer.

The electron mobility is 5,510 cm²/V·s.

Comparative Example 1

As shown in FIG. 1, 150 wafers were placed one by one in a quartz boat which was placed into a quartz tube with a volume of 24,300 cm³, wherein 35 g As was placed as well. The quartz tube was oxygenated to 0.23 atmosphere (evacuated first and then pressurized) at 25° C., and then sealed.

The sealed quartz tube was placed into a horizontal pipe-type soaking furnace. The temperature is increased to 980° C. at a rate of 100° C./h and maintained for 10 hours, and then is decreased to room temperature at a rate of 100° C./h. The tube was cut open in the vicinity of the weld sealing position by thin slice grinding wheel saw, and the resulting wafers were taken out.

10 wafers as samples are selected and measured by SIMS, and the GaAs wafer has an oxygen content of $1.5 \times 10^{16}$ atoms/cm³ in a range from the surface to the depth of 10 μm of the wafer.

After 50 μm of the surface of the wafer is removed by one side polishing, the oxygen content of the wafer is measured by SIMS, and the GaAs wafer has an oxygen content of $1.5 \times 10^{16}$ atoms/cm³ in a range from the surface to the sputtering depth of about 10 μm of the wafer.

After 80 μm of the surface of the wafer is removed by one side polishing, the oxygen content of the wafer is measured by SIMS, and the GaAs wafer has an oxygen content of $1.5 \times 10^{16}$ atoms/cm³ in a range from the surface to the sputtering depth of about 10 μm of the wafer.

After 200 μm of the surface of the wafer is removed by one side polishing, the oxygen content of the wafer is measured by SIMS, and the GaAs wafer has an oxygen content of $1.5 \times 10^{16}$ atoms/cm³ in a range from the surface to the sputtering depth of about 10 μm of the wafer.

The electron mobility is 4750 cm²/V·s.

Example 3

As shown in FIG. 1, 150 wafers were placed one by one in a quartz boat which was placed into a quartz tube with a volume of 24,300 cm³, wherein 35 g As was placed as well. The quartz tube was oxygenated to 0.23 atmosphere (evacuated first and then pressurized) at 25° C., and then sealed.

The sealed quartz tube was placed into a horizontal pipe-type soaking furnace. The temperature is increased to 1010° C. at a rate of 100° C./h and maintained for 10 hours, and then is decreased to room temperature at a rate of 90° C./h. The tube was cut open in the vicinity of the weld sealing position by thin slice grinding wheel saw, and the resulting wafers were taken out.

10 wafers as samples are selected and measured by SIMS, and the GaAs wafer has an oxygen content of $3.5 \times 10^{17}$ atoms/cm³ in a range from the surface to the depth of 10 μm of the wafer, and then the 10 sample wafers were polished. The results as follows (average value):

After 50 μm of the surface of the wafer is removed by one side polishing, the oxygen content of the wafer is measured by SIMS, and the GaAs wafer has an oxygen content of $2 \times 10^{17}$ atoms/cm³ in a range from the surface to the sputtering depth of about 10 μm of the wafer.

After 80 μm of the surface of the wafer is removed by one side polishing, the oxygen content of the wafer is measured by SIMS, and the GaAs wafer has an oxygen content of $6 \times 10^{16}$ atoms/cm³ in a range from the surface to the sputtering depth of about 10 μm of the wafer.

After 200 μm of the surface of the wafer is removed by one side polishing, the oxygen content of the wafer is measured by SIMS, and the GaAs wafer has an oxygen content of $2 \times 10^{16}$ atoms/cm³ in a range from the surface to the sputtering depth of about 10 μm of the wafer.

The electron mobility is 5,410 cm²/V·s.

Example 4

As shown in FIG. 1, 150 wafers were placed one by one in a quartz boat which was placed into a quartz tube with a volume of 24,300 cm³, wherein 30 g As was placed as well. The quartz tube was evacuated to 0.5 Torr (66.66 Pa) at 25° C., and then sealed.

The sealed quartz tube was placed into a horizontal pipe-type soaking furnace. The temperature is increased to 1180° C. at a rate of 100° C./h and maintained for 9 hours, and then is decreased to room temperature at a rate of 90° C./h. The tube was cut open in the vicinity of the weld sealing position by thin slice grinding wheel saw, and the resulting wafers were taken out.

10 wafers as samples are selected and measured by SIMS, and the GaAs wafer has an oxygen content of $5.1 \times 10^{17}$ atoms/cm³ in a range from the surface to the depth of 10 μm of the wafer, and then the 10 sample wafers were polished. The results as follows (average value):

After 50 μm of the surface of the wafer is removed by one side polishing, the oxygen content of the wafer is measured by SIMS, and the GaAs wafer has an oxygen content of $3.3\times10^{17}$ atoms/cm$^3$ in a range from the surface to the sputtering depth of about 10 μm of the wafer.

After 80 μm of the surface of the wafer is removed by one side polishing, the oxygen content of the wafer is measured by SIMS, and the GaAs wafer has an oxygen content of $6.2\times10^{16}$ atoms/cm$^3$ in a range from the surface to the sputtering depth of about 10 μm of the wafer.

After 200 μm of the surface of the wafer is removed by one side polishing, the oxygen content of the wafer is measured by SIMS, and the GaAs wafer has an oxygen content of $2.2\times10^{16}$ atoms/cm$^3$ in a range from the surface to the sputtering depth of about 10 μm of the wafer.

The electron mobility is 5,620 cm$^2$/V·s.

Example 5

As shown in FIG. 1, 150 wafers were placed one by one in a quartz boat which was placed into a quartz tube with a volume of 24,300 cm$^3$, wherein 35 g As was placed as well. The quartz tube was evacuated to 0.23 atmosphere at 25° C., and then sealed.

The sealed quartz tube was placed into a horizontal pipe-type soaking furnace. The temperature is increased to 1180° C. at a rate of 100° C./h and maintained for 10 hours, and then is decreased to room temperature at a rate of 90° C./h. The tube was cut open in the vicinity of the weld sealing position by thin slice grinding wheel saw, and the resulting wafers were taken out.

10 wafers as samples are selected and measured by SIMS, and the GaAs wafer has an oxygen content of $5.5\times10^{17}$ atoms/cm$^3$ in a range from the surface to the depth of 10 μm of the wafer, and then the 10 sample wafers were polished. The results as follows (average value):

After 50 μm of the surface of the wafer is removed by one side polishing, the oxygen content of the wafer is measured by SIMS, and the GaAs wafer has an oxygen content of $3.7\times10^{17}$ atoms/cm$^3$ in a range from the surface to the sputtering depth of about 10 μm of the wafer.

After 80 μm of the surface of the wafer is removed by one side polishing, the oxygen content of the wafer is measured by SIMS, and the GaAs wafer has an oxygen content of $6.2\times10^{16}$ atoms/cm$^3$ in a range from the surface to the sputtering depth of about 10 μm of the wafer.

After 200 μm of the surface of the wafer is removed by one side polishing, the oxygen content of the wafer is measured by SIMS, and the GaAs wafer has an oxygen content of $2.2\times10^{16}$ atoms/cm$^3$ in a range from the surface to the sputtering depth of about 10 μm of the wafer.

The electron mobility is 5,350 cm$^2$/V·s.

The results are summarized as follows:

| | Example | | Comparative Example 1 | | | |
|---|---|---|---|---|---|---|
| | 1 | 2 | | 3 | 4 | 5 |
| Temperature, ° C. | 1080 | 1080 | 980 | 1010 | 1180 | 1180 |
| Pressure, atm | vacuum | 0.23 | 0.23 | 0.23 | vacuum | 0.23 |

| | Example | | Comparative Example 1 | | | |
|---|---|---|---|---|---|---|
| | 1 | 2 | | 3 | 4 | 5 |
| Oxygen content distribution (×10$^{17}$) | | | | | | |
| 10 μm | 4.2 | 4.7 | 0.15 | 3.5 | 5.1 | 5.5 |
| 50 μm | 2 | 2.3 | 0.15 | 2 | 3.3 | 3.7 |
| 80 μm | 0.6 | 0.6 | 0.15 | 0.6 | 0.62 | 0.62 |
| 200 μm | 0.2 | 0.2 | 0.15 | 0.2 | 0.22 | 0.22 |
| Electron mobility (cm$^2$/v·s) | | | | | | |
| Before heat treatment | 3866 | 3866 | 3866 | 3866 | 3866 | 3866 |
| After heat treatment | 5760 | 5510 | 4750 | 5410 | 5620 | 5350 |

It can be understood that the above examples are in no way limiting the contents of the present invention. Any amendments and modifications can be made without departing from the spirit and the scope of the appending claims.

What is claimed is:

1. A GaAs single crystal wafer, having a thickness of 250 to 1000 μm and one of or both of the following two properties:
   an oxygen content of $1.6\times10^{16}$-$5.6\times10^{17}$ atoms/cm$^3$ in a range from the surface to a depth of 10 μm of the wafer; and
   an electron mobility of 4,800 cm$^2$/V·S to 5,850 cm$^2$/V·s.

2. The GaAs single crystal wafer according to claim 1, having an oxygen content of $3.5\times10^{16}$-$5.6\times10^{17}$ atoms/cm$^3$ in a range from the surface to a depth of about 10 μm of the wafer.

3. The GaAs single crystal wafer according to claim 1, having an oxygen content of $2\times10^{17}$-$5.6\times10^{17}$ atoms/cm$^3$ in a range from the surface to a depth of about 10 μm of the wafer, an oxygen content of $0.8$-$4\times10^{17}$ atoms/cm$^3$ at the depth of 50-60 μm of the wafer, and an oxygen content of $2$-$6.5\times10^{16}$ atoms/cm$^3$ at the depth of 80-90 μm of the wafer.

4. A method for preparing a GaAs single crystal wafer having a thickness of 250 to 1000 μm and one of or both of the following two properties:
   an oxygen content of $1.6\times10^{16}$-$5.6\times10^{17}$ atoms/cm$^3$ in a range from the surface to a depth of 10 μm of the wafer; and
   an electron mobility of 4,800 cm$^2$/V·s to 5,850 cm$^2$/V·s;
   the method comprising:
   placing a single crystal wafer to be processed in a container by an open quartz boat wherein the wafer is kept in a vertical position standing on the wafer edge; and
   sealing said container, and keeping GaAs single crystal at a temperature of 1000-1200° C. for 5-20 hours.

5. The method according to claim 4, wherein said container is a container made of quartz material.

6. The method according to claim 5, wherein after said wafer is placed in said container, As is placed in the container as well.

7. The method according to claim 5, wherein the resulting wafer has an oxygen content of $2\times10^{17}$-$5.6\times10^{17}$ atoms/cm$^3$ in a range from the surface to a depth of about 10 μm of the wafer, an oxygen content of $0.8$-$4\times10^{17}$ atoms/cm$^3$ at the depth of 50-60 μm of the wafer, and an oxygen content of $2$-$6.5\times10^{16}$ atoms/cm$^3$ at the depth of 80-90 μm of the wafer.

8. The method according to claim 4, wherein after said wafer is placed in said container, As is placed in the container as well.

9. The method according to claim 4, wherein the resulting wafer has an oxygen content of $2 \times 10^{17}$-$5.6 \times 10^{17}$ atoms/cm$^3$ in a range from the surface to a depth of about 10 μm of the wafer, an oxygen content of $0.8$-$4 \times 10^{17}$ atoms/cm$^3$ at the depth of 50-60 μm of the wafer, and an oxygen content of $2$-$6.5 \times 10^{16}$ atoms/cm$^3$ at the depth of 80-90 μm of the wafer.

\* \* \* \* \*

UNITED STATES PATENT AND TRADEMARK OFFICE
CERTIFICATE OF CORRECTION

PATENT NO. : 9,691,617 B2
APPLICATION NO. : 14/388236
DATED : June 27, 2017
INVENTOR(S) : Morris Young et al.

Page 1 of 1

It is certified that error appears in the above-identified patent and that said Letters Patent is hereby corrected as shown below:

Column 10, Line 56 (Claim 6): "The method according to claim 5" should be --The method according to claim 4--.

Column 10, Line 59 (Claim 7): "The method according to claim 5" should be --The method according to claim 4--.

Column 10, Line 65 (Claim 8): "The method according to claim 4" should be --The method according to claim 5--.

Column 11, Line 1 (Claim 9): "The method according to claim 4" should be --The method according to claim 5--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*